US012787871B2

(12) United States Patent
Lee et al.

(10) Patent No.: US 12,787,871 B2
(45) Date of Patent: Nov. 3, 2026

(54) SEMICONDUCTOR PACKAGE

(71) Applicant: SAMSUNG ELECTRONICS CO., LTD., Suwon-si (KR)

(72) Inventors: Nara Lee, Suwon-si (KR); Yeonjin Lee, Suwon-si (KR); Jimin Choi, Suwon-si (KR); Jongmin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/230,768

(22) Filed: Aug. 7, 2023

(65) Prior Publication Data

US 2024/0113077 A1 Apr. 4, 2024

(30) Foreign Application Priority Data

Sep. 29, 2022 (KR) ........................ 10-2022-0124359

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 40/10* (2026.01);
(Continued)

(58) Field of Classification Search
CPC ............. H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/49827; H01L 23/5384; H01L 23/481; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2225/06541–06544; H01L 2225/06548; H01L 21/76898; H01L 21/486; H01L 23/36; H01L 23/373;
(Continued)

(56) References Cited

U.S. PATENT DOCUMENTS

| | | | |
|---|---|---|---|
| 7,649,249 | B2 | 1/2010 | Noguchi |
| 8,314,483 | B2 | 11/2012 | Lin et al. |

(Continued)

FOREIGN PATENT DOCUMENTS

| | | | |
|---|---|---|---|
| KR | 10-1428754 | B1 | 8/2014 |
| KR | 1020220126883 | A | 9/2022 |

*Primary Examiner* — Wael M Fahmy
*Assistant Examiner* — Quinton A Brasfield
(74) *Attorney, Agent, or Firm* — Muir Patent Law, PLLC

(57) ABSTRACT

A semiconductor package includes a plurality of first semiconductor chips sequentially stacked, each of the first semiconductor chips including a circuit layer on a first surface of a first substrate, a through-silicon via passing through the first substrate, and a bump pad connected to the through-silicon via, and a second semiconductor chip on an uppermost first semiconductor chip, the second semiconductor chip including a circuit layer on a first surface of a second substrate, and a thermal path via in the second substrate.

17 Claims, 14 Drawing Sheets

(51) Int. Cl.

| | |
|---|---|
| ***H10W 40/10*** | (2026.01) |
| ***H10W 72/20*** | (2026.01) |
| ***H10W 74/10*** | (2026.01) |
| ***H10W 90/20*** | (2026.01) |

(52) U.S. Cl.
CPC ........ *H10W 74/111* (2026.01); *H10W 72/265* (2026.01); *H10W 90/288* (2026.01); *H10W 90/297* (2026.01); *H10W 90/722* (2026.01)

(58) Field of Classification Search
CPC ....... H01L 23/3735–3736; H01L 23/42; H01L 21/4871–4882; H01L 2225/06589; H01L 23/3185; H01L 23/3157; H01L 21/56; H01L 21/563; H01L 21/568; H01L 23/5389; H05K 1/185; H10W 90/20–297; H10W 90/701–798; H10W 20/20–233; H10W 20/01; H10W 20/021–0265; H10W 70/63–635; H10W 74/00–481; H10W 76/60–67; H10W 42/20–287; H10W 42/121; H10W 72/823; H10W 40/10; H10W 40/233; H10W 40/242; H10W 40/253; H10W 40/613
See application file for complete search history.

(56) References Cited

U.S. PATENT DOCUMENTS

| | | | | |
|---|---|---|---|---|
| 8,358,016 | B2 | 1/2013 | Suh et al. | |
| 8,604,615 | B2 * | 12/2013 | Lee | H10W 74/012<br>257/734 |
| 8,922,000 | B2 | 12/2014 | Han | |
| 8,941,233 | B1 * | 1/2015 | Ngai | H10W 20/023<br>257/706 |
| 9,613,881 | B2 | 4/2017 | Ahn et al. | |
| 11,239,095 | B2 | 2/2022 | Hembree et al. | |
| 2016/0181174 | A1 * | 6/2016 | Gambino | H10W 20/023<br>438/666 |
| 2016/0260687 | A1 * | 9/2016 | Gao | H10W 40/10 |
| 2016/0343687 | A1 * | 11/2016 | Vadhavkar | H10P 54/00 |
| 2021/0225708 | A1 * | 7/2021 | Lee | H10P 54/00 |
| 2022/0173008 | A1 * | 6/2022 | Kim | H10W 40/22 |

* cited by examiner

SEMICONDUCTOR PACKAGE

CROSS-REFERENCE TO RELATED APPLICATIONS

Korean Patent Application No. 10-2022-0124359, filed on Sep. 29, 2022, in the Korean Intellectual Property Office, is incorporated by reference herein in its entirety.

BACKGROUND

1. Field

A semiconductor package is disclosed.

2. Description of the Related Art

Recently, a semiconductor package may have a structure in which a plurality of semiconductor chips are stacked and packaged.

SUMMARY

Embodiments are directed to a semiconductor package including a plurality of first semiconductor chips sequentially stacked, each of the first semiconductor chips including a circuit layer on a first surface of a first substrate, a through-silicon via passing through the first substrate, a bump pad connected to the through-silicon via, and a second semiconductor chip on an uppermost first semiconductor chip, the second semiconductor chip including a circuit layer on a first surface of a second substrate, and a thermal path via in the second substrate.

Embodiments are directed to a semiconductor package including a first semiconductor chip including a circuit layer on a first surface of a first substrate, a first through-silicon via passing through the first substrate, a first lower bump on the first surface of the first substrate connected to the first through-silicon via, and a first upper bump pad on a second surface facing the first surface of the first substrate connected to the first through-silicon via, a second semiconductor chip including a circuit layer on a first surface of a second substrate, a second through-silicon via passing through the second substrate, a second lower bump on the first surface of the second substrate connected to the second through-silicon via, a second upper bump pad on a second surface facing the first surface of the second substrate connected to the second through-silicon via, and a first conductive bump for bonding the first and second semiconductor chips between the first upper bump pad and the second lower bump pad, a third semiconductor chip including a circuit layer on a first surface of a third substrate, a thermal path via extending from the first surface of the third substrate to an inside of the third substrate and the thermal path via in the third substrate, a third lower bump on the first surface of the third substrate, and a third conductive bump for bonding the second and third semiconductor chips between the second upper bump pad and the third lower bump pad, and a sealing member covering the first to third semiconductor chips, wherein the third semiconductor chip is an uppermost chip.

Embodiments are directed to a semiconductor package including a plurality of first semiconductor chips sequentially stacked, each of the first semiconductor chips include a circuit layer on a first surface of a first substrate, a through-silicon via passing through the first substrate, and a bump pad connected to the through-silicon via, and a second semiconductor chip stacked on an uppermost first semiconductor chip, the second semiconductor chip includes a circuit layer on a first surface of a second substrate, and a thermal path via extending from the first surface of the third substrate to an inside of the third substrate and the thermal path via in the second substrate, wherein the through-silicon via includes a first conductive pattern passing through the first substrate and a first insulation liner surrounding a sidewall of the first conductive pattern, the second semiconductor chip is an uppermost chip, and the thermal path via includes a second conductive pattern in a hole extending to an inner portion of the second substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
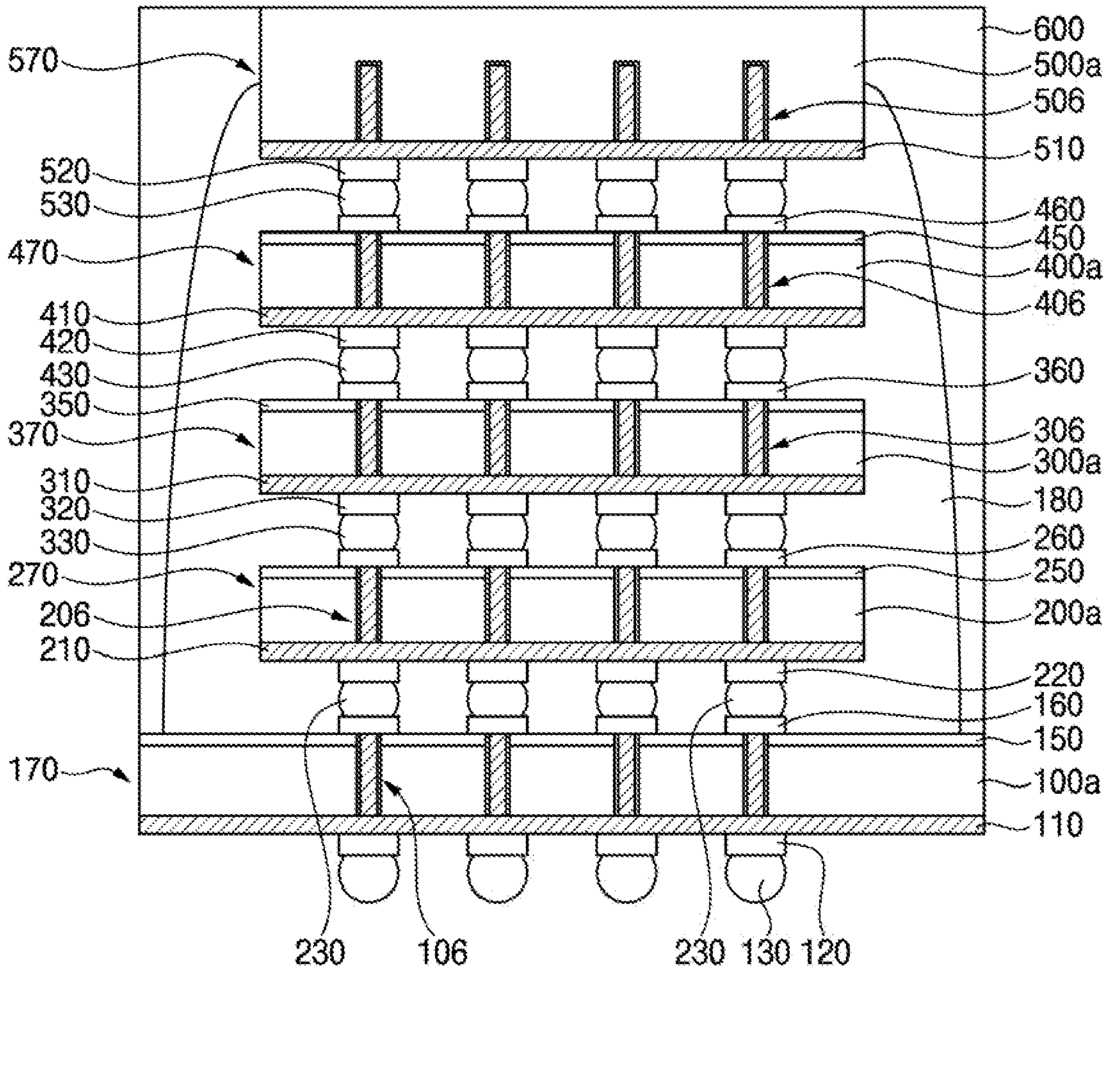
FIG. 1 is a cross-sectional view of a semiconductor package according to example embodiments.
Figure 2:
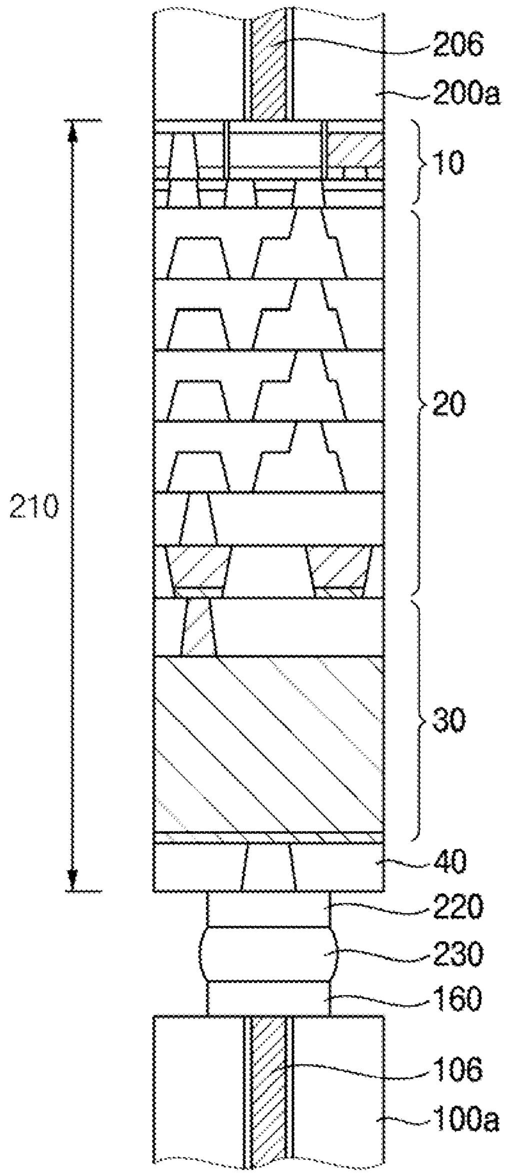
FIG. 2 is an enlarged cross-sectional view of a portion of a circuit layer included in a semiconductor chip in a semiconductor package according to example embodiments.
Figure 3A:
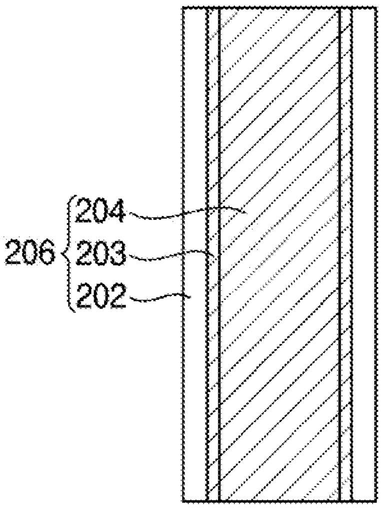
FIG. 3A is an enlarged cross-sectional view of a through-silicon via included in a semiconductor chip in a semiconductor package according to example embodiments.
Figure 3B:
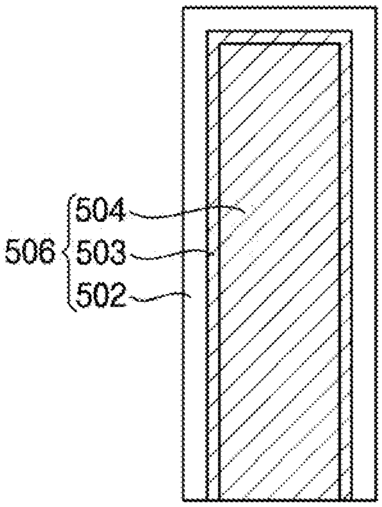
FIG. 3B is an enlarged cross-sectional view of a thermal path via included in an uppermost semiconductor chip in a semiconductor package according to example embodiments.
Figure 3C:
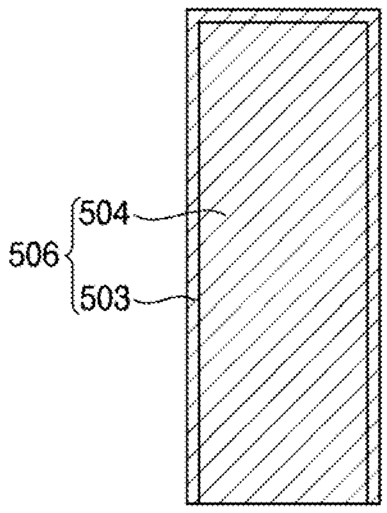
FIG. 3C is an enlarged cross-sectional view of a thermal path via included in an uppermost semiconductor chip in a semiconductor package according to some example embodiments.

FIG. 1 is a cross-sectional view of a semiconductor package according to example embodiments. FIG. 2 is an enlarged cross-sectional view of a portion of a circuit layer included in a semiconductor chip in a semiconductor package according to example embodiments. FIG. 3A is an enlarged cross-sectional view of a through-silicon via included in a semiconductor chip in a semiconductor package according to example embodiments. FIG. 3B is an enlarged cross-sectional view of a thermal path via included in an uppermost semiconductor chip in a semiconductor package according to example embodiments. FIG. 3C is an enlarged cross-sectional view of a thermal path via included in an uppermost semiconductor chip in a semiconductor package according to some example embodiments.

Referring to FIGS. 1 and 2, a semiconductor package may include stacked semiconductor chips 170, 270, 370, 470 and 570. The semiconductor package may include an adhesive material 180 filling gaps between the stacked semiconductor chips 170, 270, 370, 470 and 570. The stacked semiconductor chips 170, 270, 370, 470 and 570 may be attached to each other by the adhesive material 180.

The semiconductor chips 170, 270, 370, 470, and 570 may be stacked in a vertical direction. In an implementation, the semiconductor package including five stacked semiconductor chips 170, 270, 370, 470 and 570 is illustrated in FIG. 1. The semiconductor package may include first to fifth semiconductor chips 170, 270, 370, 470 and 570 sequentially stacked. The first semiconductor chip 170 may be a lowermost semiconductor chip, and the fifth semiconductor chip 570 may be an uppermost semiconductor chip.

Hereinafter, the semiconductor package including five stacked semiconductor chips 170, 270, 370, 470 and 570 may be described. Each of the first to fifth semiconductor chips 170, 270, 370, 470 and 570 may be an integrated circuit chip manufactured by semiconductor manufacturing processes. Each of the semiconductor chips 170, 270, 370, 470 and 570 may include, e.g., a memory chip or a logic chip. As used herein, the term "or" is not an exclusive term, e.g., "A or B" would include A, B, or A and B.

In example embodiments, the semiconductor package may include a memory device. The memory device may include, e.g., a high bandwidth memory (HBM) device. Each of the semiconductor chips included in the semiconductor package may be described.

The first semiconductor chip 170 may include a first substrate 100*a* having first and second surfaces facing each other, a first circuit pattern, a first multilayer wiring, a first uppermost wiring and a first lower passivation layer on the first surface of the first substrate 100*a*, a first through-silicon via 106 passing through the first substrate 100*a*, a first lower bump pad 120 and a first conductive bump 130 on the first surface of the first substrate 100*a*, and a first upper bump pad 160 on the second surface of the first substrate 100*a*. The first circuit pattern, the first multilayer wiring, the first uppermost wiring and the first lower passivation layer are simply shown as one first circuit layer 110. A first upper passivation layer 150 may be on the second surface of the first substrate 100*a*. A plurality of first through-silicon vias 106 may be formed through the first substrate 100*a*. The first semiconductor chip 170 included in the semiconductor package may be disposed so that the first surface of the first substrate 100*a* on which the first circuit pattern is formed may face downward.

In example embodiments, the first circuit pattern may include circuit patterns for controlling operations of the second to fifth semiconductor chips 270, 370, 470 and 570 on the first semiconductor chip 170. In example embodiments, the first circuit patterns may include, e.g., transistors, lower wiring, resistors, diodes, or capacitors.

The second semiconductor chip 270 may include a second substrate 200*a* having first and second surfaces facing each other, a second circuit pattern, a second multilayer wiring, a second uppermost wiring and a second lower passivation layer, a second through-silicon via 206 passing through the second substrate 200*a*, a second lower bump pad 220 and a second conductive bump 230 on the first surface of the second substrate 200*a*, and a second upper bump pad 260 on the second surface of the second substrate 200*a*. The second circuit pattern, the second multilayer wiring, the second uppermost wiring and the second lower passivation layer are simply shown as one second circuit layer 210. A second upper passivation layer 250 may be on the second surface of the second substrate 200*a*. A plurality of second through-silicon vias 206 may be formed through the second substrate 200*a*.

Hereinafter, the second circuit layer may be described with reference to FIG. 2. In example embodiments, the second circuit pattern 10 may include DRAM memory cells. In example embodiments, the second circuit pattern 10 may include, e.g., transistors, bit line structures, lower wiring, resistors, diodes, or capacitors.

In the second multilayer wiring 20, a wiring including a via contact and a conductive line may be stacked in multiple layers. The second multilayer wiring 20 may include a metal, e.g., copper.

The second uppermost wiring 30 may include an uppermost via and an uppermost conductive pattern on the uppermost via. The uppermost via may include metal, e.g., tungsten, copper or aluminum. The uppermost conductive pattern may include, e.g., aluminum.

The second lower passivation layer 40 may include an insulation material. In example embodiments, the second lower passivation layer 40 may include, e.g., silicon oxide or silicon nitride. Alternatively, the second lower passivation layer 40 may have a structure in which silicon oxide and silicon nitride may be stacked.

Second lower bump pads 220 may pass through the second lower passivation layer 40, and may contact the second uppermost wiring 30. The second lower bump pads 220 may be on a surface of the second lower passivation layer 40. The second lower bump pads 220 may include a metal, e.g., aluminum or copper. The second conductive bump 230 may be on the second lower bump pad 220.

The second through-silicon via 206 may pass through second substrate 200*a*. The second through-silicon via 206 may extend from the first surface of the second substrate 200*a* to the second surface of the second substrate 200*a*.

Referring to FIG. 3A, the second through-silicon via 206 may be in a through hole passing through the second substrate 200*a*. The through-silicon via 206 may include an insulation liner 202 on a sidewall of the through hole, a barrier metal layer 203 on the insulation liner 202, and a metal pattern 204 filling the through hole on the barrier metal layer 203. The metal pattern 204 may pass through the second substrate 200*a*. The barrier metal layer 203 may include, e.g., titanium, titanium nitride, tantalum, or tantalum nitride. The metal pattern 204 may include, e.g., copper. The insulation liner 202 and the barrier metal layer 203 may surround a sidewall of the metal pattern 204. In example embodiments, the through-silicon vias (e.g., first to fourth through-silicon vias) in each of semiconductor chips may have a cross-sectional structure shown in FIG. 3A.

The second upper passivation layer 250 may be on the second surface of the second substrate 200*a*. In this case, the second through-silicon via 206 may pass through the second upper passivation layer 250.

One second upper bump pad 260 may be matched with one second through-silicon via 206, and the one second upper bump pad 260 may be on the one second through-silicon via 206. The second upper bump pad 260 may be positioned on the second surface of the second substrate 200*a*. In example embodiments, the second upper bump pad 260 may contact the second through-silicon via 206, so that the second upper bump pad 260 may be electrically connected to the second through-silicon via 206. In example embodiments, the second lower bump pad 220 may be electrically connected to the second through-silicon via 206 by, e.g., the second multilayer wiring and the second uppermost wiring.

In example embodiments, the second semiconductor chip 270 may be a different chip from the first semiconductor chip. In this case, at least a second circuit pattern and multilayer wiring included in the second semiconductor chip 270 may be different from those of the first semiconductor chip 170. In some example embodiments, the second semiconductor chip 270 may be the same chip as the first semiconductor chip 170.

The first surface of the second substrate 200*a* may be opposite to the second surface of the first substrate 100*a*. The second conductive bump 230 of the second semiconductor chip 270 may be directly bonded to the first upper bump pad 160 of the first semiconductor chip 170.

The second semiconductor chip 270 may be mounted on the first semiconductor chip 170 by a flip chip bonding process. The second conductive bump 230 may be between the first upper bump pad 160 and the second lower bump pad 220, so that the first and second semiconductor chips 170 and 270 may be bonded to each other. The second lower bump pads 220 of the second semiconductor chip 270 may be electrically connected to the first upper bump pads 160 of the first semiconductor chip 170 by the second conductive bumps 230.

The third semiconductor chip 370 may include a third substrate 300*a* having first and second surfaces facing each other, a third circuit pattern, a third multilayer wiring, third uppermost wiring and third lower passivation layer on the first surface of the third substrate 300*a*, third through-silicon via 306 passing through the third substrate 300*a*, a third lower bump pad 320 and a third conductive bump 330 on the first surface of the third substrate 300*a*, and a third upper bump pad 360 on the second surface of the third substrate 300*a*.

The third circuit pattern, the third multilayer wiring, the third uppermost wiring and the third lower passivation layer are simply shown as one third circuit layer 310. A third upper passivation layer 350 may be on the second surface of the third substrate 300*a*. A plurality of third through-silicon vias 306 may be formed through the third substrate 300*a*.

In example embodiments, the second to fifth semiconductor chips 270, 370, 470 and 570 may be substantially the same semiconductor chips. In some example embodiments, at least one of the second to fifth semiconductor chips 270, 370, 470 and 570 may be a different semiconductor chip. The third conductive bump 330 of the third semiconductor chip 370 may be directly bonded to the second upper bump pad 260 of the second semiconductor chip 270.

The fourth semiconductor chip 470 may include a fourth substrate 400*a* having first and second surfaces facing each other, a fourth circuit pattern, a fourth multilayer wiring, a fourth uppermost wiring and a fourth lower passivation layer on the first surface of the fourth substrate 400*a*, a fourth through-silicon via 406 passing through the fourth substrate 400*a*, a fourth lower bump pad 420 and a fourth conductive bump 430 on the first surface of the fourth substrate 400*a*, and a fourth upper bump pad 460 on the second surface of the fourth substrate 400*a*.

The fourth circuit pattern, the fourth multilayer wiring, the fourth uppermost wiring, and the fourth lower passivation layer are simply shown as one fourth circuit layer 410. A fourth upper passivation layer 450 may be on the second surface of the fourth substrate 400*a*. A plurality of fourth through-silicon vias 406 may be formed through the fourth substrate 400*a*. The fourth conductive bump 430 of the fourth semiconductor chip 470 may be directly bonded to the third upper bump pad 360 of the third semiconductor chip 370.

The fifth semiconductor chip 570, which may be an uppermost semiconductor chip, may include a fifth substrate 500*a* having first and second surfaces facing each other, a fifth circuit pattern, a fifth multilayer wiring, a fifth uppermost wiring and a fifth lower passivation layer on the first surface of the fifth substrate 500*a*, a thermal path via 506 in the fifth substrate 500*a*, a fifth lower bump pad 520 and a fifth conductive bump 530 on the first surface of the fifth substrate 500*a*. The fifth circuit pattern, the fifth multilayer wiring, the fifth uppermost wiring and the fifth lower passivation layer are simply shown as one fifth circuit layer 510. A plurality of thermal path vias 506 may be in the fifth substrate 500*a*.

The fifth conductive bump 530 of the fifth semiconductor chip 570 may be directly bonded to the fourth upper bump pad 460 of the fourth semiconductor chip 470. In the case of the uppermost semiconductor chip, since there is no semiconductor chip stacked thereon, a fifth upper bump pad may not be on the second surface of the fifth substrate 500*a*.

The thermal path via 506 may extend from the first surface of the fifth substrate 500*a* to an inside of the fifth substrate 500*a*. The thermal path via 506 may be at the inside portion of the fifth substrate 500*a*. An upper surface of the thermal path via 506, which may be a surface of the thermal path via 506 farthest from the first surface of the fifth substrate 500*a*, may be positioned at the inner portion of the fifth substrate 500*a*.

In example embodiments, a vertical height of the thermal path via 506 in the fifth substrate 500*a* may be about 10% to about 90% of a total thickness of the fifth substrate 500*a*. When the height of the thermal path via 506 is less than 10% of the total thickness of the fifth substrate 500*a*, a thermal resistance reduction effect may be decreased. When the height of the thermal path via 506 is greater than 90% of the total thickness of the fifth substrate 500*a*, defects may occur during processes for forming the thermal path vias 506.

The thermal path via 506 may include a material having a thermal conductivity higher than a thermal conductivity of the fifth substrate 500*a*. In an implementation, the thermal path via 506 may include the material having the thermal conductivity higher than a thermal conductivity of silicon.

In example embodiments, the thermal path via 506 may include a metal. In example embodiments, the thermal path via 506 may include the metal the same as a metal of the first to fourth through-silicon vias 106, 206, 306 and 406. In an implementation, the thermal path via 506 may include copper.

In some example embodiments, the thermal path via 506 may include a conductive material different from a material of the first through fourth through-silicon vias 106, 206, 306 and 406. In an implementation, the thermal path via 506 may include aluminum (Al), tungsten, nickel (Ni), molybdenum (Mo), gold (Au), or silver (Ag). In some example embodiments, the thermal path via 506 may include graphene, or diamond.

In some example embodiments, the thermal path via 506 may include a non-conductive material. In an implementation, the thermal path via 506 may include PETEOS, SiCOH, SiN, or SiCN.

In example embodiments, the thermal path via 506 may have a diameter the same as a diameter of each of the first through fourth through-silicon vias 106, 206, 306 and 406. Further, the thermal path via 506 may have the vertical height the same as a vertical height of each of the first through fourth through-silicon vias 106, 206, 306 and 406. In an implementation, processes for forming the thermal path via 506 may be the same as processes for forming the first to fourth through-silicon vias 106, 206, 306 and 406.

As the thermal path via 506 including the material having high thermal conductivity may be included in the uppermost semiconductor chip, heat generated in each of semiconductor chips may be easily dissipated to an outside of the semiconductor package. Accordingly, thermal resistance of the semiconductor package may be decreased.

Each of the thermal path vias 506 may be aligned with the first to fourth through-silicon vias 106, 206, 306 and 406 in the vertical direction. The thermal path vias 506 may have a layout (i.e., arrangement) the same as a layout of each of the first through fourth through-silicon vias 106, 206, 306 and 406. The thermal path vias 506 may be aligned with the fifth lower bump pads 520 in the vertical direction, respectively.

In example embodiments, the thermal path via 506 may not be electrically connected to the fifth lower bump pad 520. In some example embodiments, the thermal path via 506 may be electrically connected to the fifth lower bump pad 520. Even though the thermal path via 506 may be electrically connected to the fifth lower bump pad 520, one end (e.g., upper surface) of the thermal path via 506 may be electrically floated. Thus, the thermal path via 506 may not affect in an operation of the semiconductor package.

In example embodiments, as shown in FIG. 3B, the thermal path via 506 may include a fifth insulation liner 502 extending along a sidewall and an upper surface of the via hole, a fifth barrier metal layer 503 on the fifth insulation liner 502, and a fifth conductive pattern 504 filling the via hole on the fifth barrier metal layer 503. Accordingly, a conductive material of the thermal path via 506 may not directly contact the fifth substrate 500*a*. The fifth insulation liner 502 and the fifth barrier metal layer 503 may surround a sidewall and an upper surface of the fifth conductive pattern 504.

In some example embodiments, as shown in FIG. 3C, the thermal path via 506 may include a fifth barrier metal layer 503 along a sidewall and an upper surface of the via hole, and a fifth conductive pattern 504 filling the via hole on the fifth barrier metal layer 503. A fifth insulation liner may not be in the via hole. Thus, a conductive material of the thermal path via 506 may directly contact the fifth substrate 500*a*. In this case, the thermal path via 506 may not be electrically connected to other wirings.

In example embodiments, the semiconductor package may further include the adhesive material 180 for bonding the first to fifth semiconductor chips 170, 270, 370, 470 and 570 to each other. The adhesive material 180 may fill between the first to fifth semiconductor chips 170, 270, 370, 470 and 570. In an implementation, the adhesive material 180 may include a non-conductive layer (e.g., non-conductive film NCF) material.

In example embodiments, the semiconductor package may further include a sealing member 600 covering the second to fifth semiconductor chips 270, 370, 470 and 570 on the first semiconductor chip 170. The sealing member 600 may cover sidewalls of the second to fifth semiconductor chips 270, 370, 470 and 570. In addition, the sealing member 600 may cover an upper surface of the fifth semiconductor chip 570, which may be an uppermost semiconductor chip. In an implementation, the sealing member 600 may include a thermosetting resin.

As described above, the semiconductor package may include the thermal path via in the substrate of the uppermost semiconductor chip in the semiconductor package. Thus, heat generated in each of the semiconductor chips may be easily dissipated to the outside of the semiconductor package. Accordingly, thermal resistance of the semiconductor package may be decreased.

Various example embodiments in which the arrangement, volume, or material of the thermal path via 506 included in the uppermost semiconductor chip are changed may be presented. In each of example embodiments, a vertical cross-section of the thermal path via may be the same as that shown in FIG. 3B or FIG. 3C.

Figure 4:
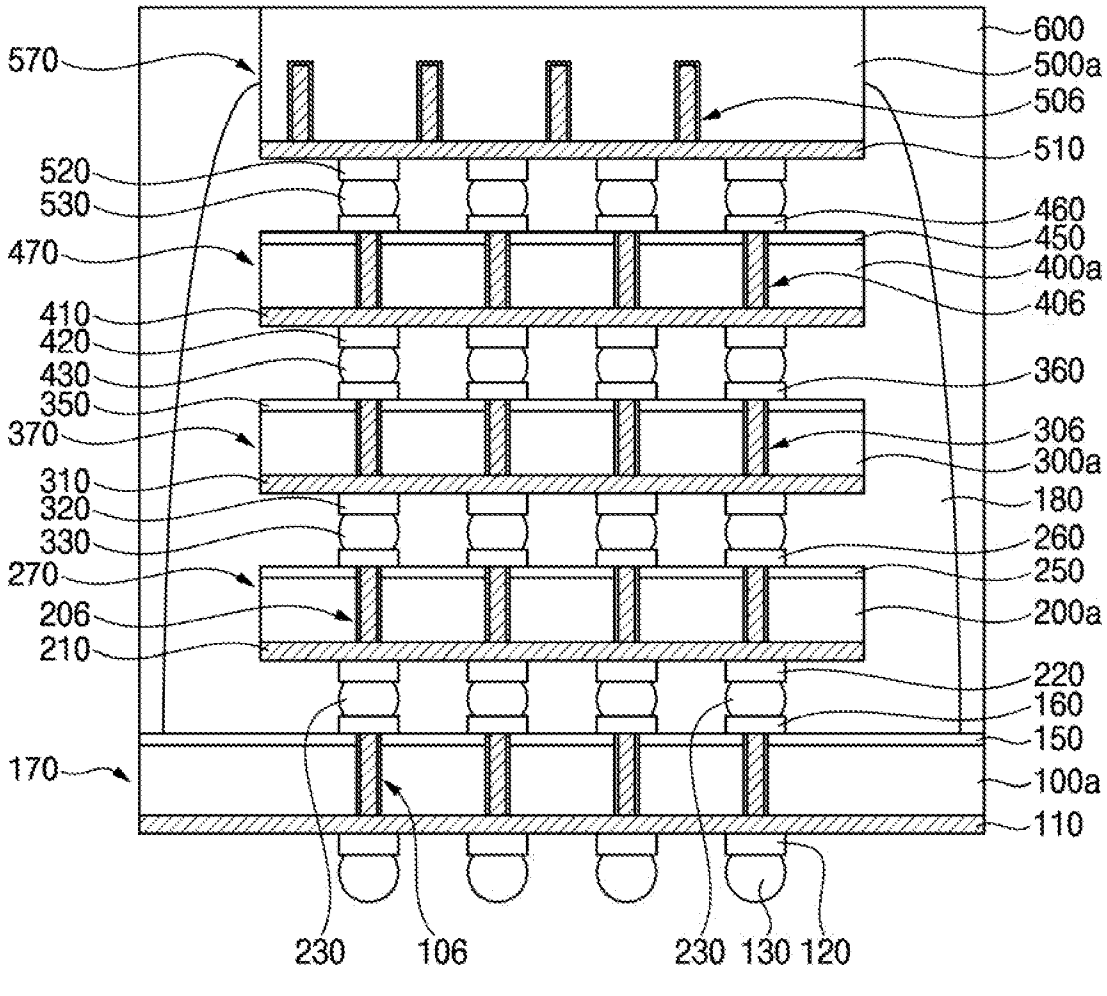
FIG. 4 is a cross-sectional view of a semiconductor package according to example embodiments.

FIG. 4 is a cross-sectional view of a semiconductor package according to example embodiments. The semiconductor package shown in FIG. 4 may be the same as the semiconductor package shown in FIG. 1, except for thermal path vias of an uppermost semiconductor chip. Therefore, the thermal path vias of the uppermost semiconductor chip are mainly described.

Referring to FIG. 4, a semiconductor package may include stacked semiconductor chips 170, 270, 370, 470 and 570. The semiconductor package may include adhesive material 180 filling gaps between the stacked semiconductor chips 170, 270, 370, 470 and 570. The stacked the semiconductor chips 170, 270, 370, 470 and 570 may be bonded to each other.

The fifth semiconductor chip 570, which may be an uppermost semiconductor chip of the semiconductor package, may include the thermal path via 506 in the fifth substrate 500*a*. A plurality of thermal path vias 506 may be in the fifth substrate 500*a*. The thermal path via 506 may be the same as the thermal path via 506 described in FIG. 1, except for an arrangement thereof.

The thermal path vias 506 may have an arrangement different from arrangements of the first to fourth through-silicon vias 106, 206, 306 and 406. In an implementation, the thermal path vias 506 may have a layout different from a layout of each of the first to fourth through-silicon vias 106, 206, 306 and 406. In an implementation, each of the thermal path vias 506 may not be aligned with the first to fourth through-silicon vias 106, 206, 306 and 406 in the vertical direction. The thermal path vias 506 may not be aligned with the fifth lower bump pads 520 in the vertical direction, respectively.

In example embodiments, the thermal path vias 506 may not be electrically connected to the fifth lower bump pad 520. In some example embodiments, the thermal path vias 506 may be electrically connected to the fifth lower bump pad 520 by the fifth multilayer wiring and the fifth uppermost wiring.

Figure 5:
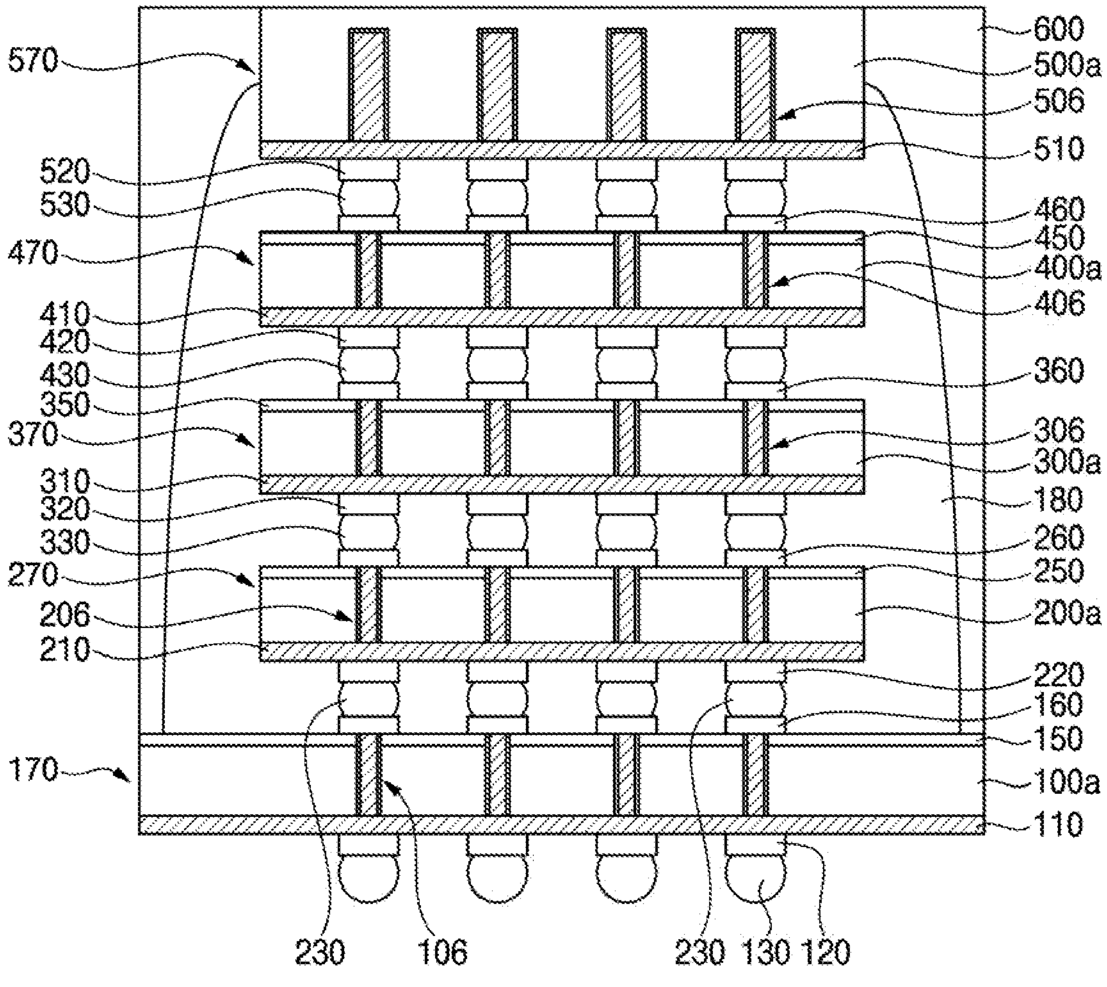
FIG. 5 is a cross-sectional view of a semiconductor package according to example embodiments.

FIG. 5 is a cross-sectional view of a semiconductor package according to example embodiments. The semiconductor package shown in FIG. 5 may have the same as the semiconductor package shown in FIG. 1, except for an uppermost semiconductor chip. Therefore, the uppermost semiconductor chip is mainly described.

Referring to FIG. 5, a semiconductor package may include stacked semiconductor chips 170, 270, 370, 470 and 570. The semiconductor package may include an adhesive material 180 filling gaps between the stacked semiconductor chips 170, 270, 370, 470 and 570. The stacked semiconductor chips 170, 270, 370, 470 and 570 may be bonded to each other.

The fifth semiconductor chip 570, which may be the uppermost semiconductor chip of the semiconductor package, may include the thermal path via 506 in the fifth substrate 500*a*. A plurality of thermal path vias 506 may be in the fifth substrate 500*a*.

The thermal path via 506 may be the same as the thermal path via 506 described in FIG. 1, except for a volume of the thermal path via 506. The thermal path via 506 may have a volume different from a volume of each of the first to fourth through-silicon vias 106, 206, 306 and 406.

In example embodiments, the thermal path via 506 may have a volume greater than each of the first to fourth through-silicon vias 106, 206, 306 and 406. In an implementation, the thermal path via 506 may have a diameter greater than each of the first to fourth through-silicon vias 106, 206, 306 and 406. In an implementation, the thermal path via 506 may have a vertical depth greater than a vertical depth of each of the first through fourth through-silicon vias 106, 206, 306 and 406. In an implementation, as shown in FIG. 5, the thermal path via 506 may have a diameter greater than a diameter of each of the first to fourth through-silicon vias 106, 206, 306, and 406, and may have a vertical depth greater than each of the first to fourth through-silicon vias 106, 206, 306, and 406.

As the volume of the thermal path via 506 increases, a volume of metal having high thermal conductivity increases. Thus, a thermal resistance of the semiconductor package may decrease.

In some example embodiments, the thermal path via 506 may have a volume less than a volume of each of the first to fourth through-silicon vias 106, 206, 306 and 406. If it is not easy to form the thermal path via 506 having a volume greater than a volume of each of the first through fourth through-silicon vias 106, 206, 306 and 406, the volume of the thermal path via 506 may be adjusted.

Figure 6:
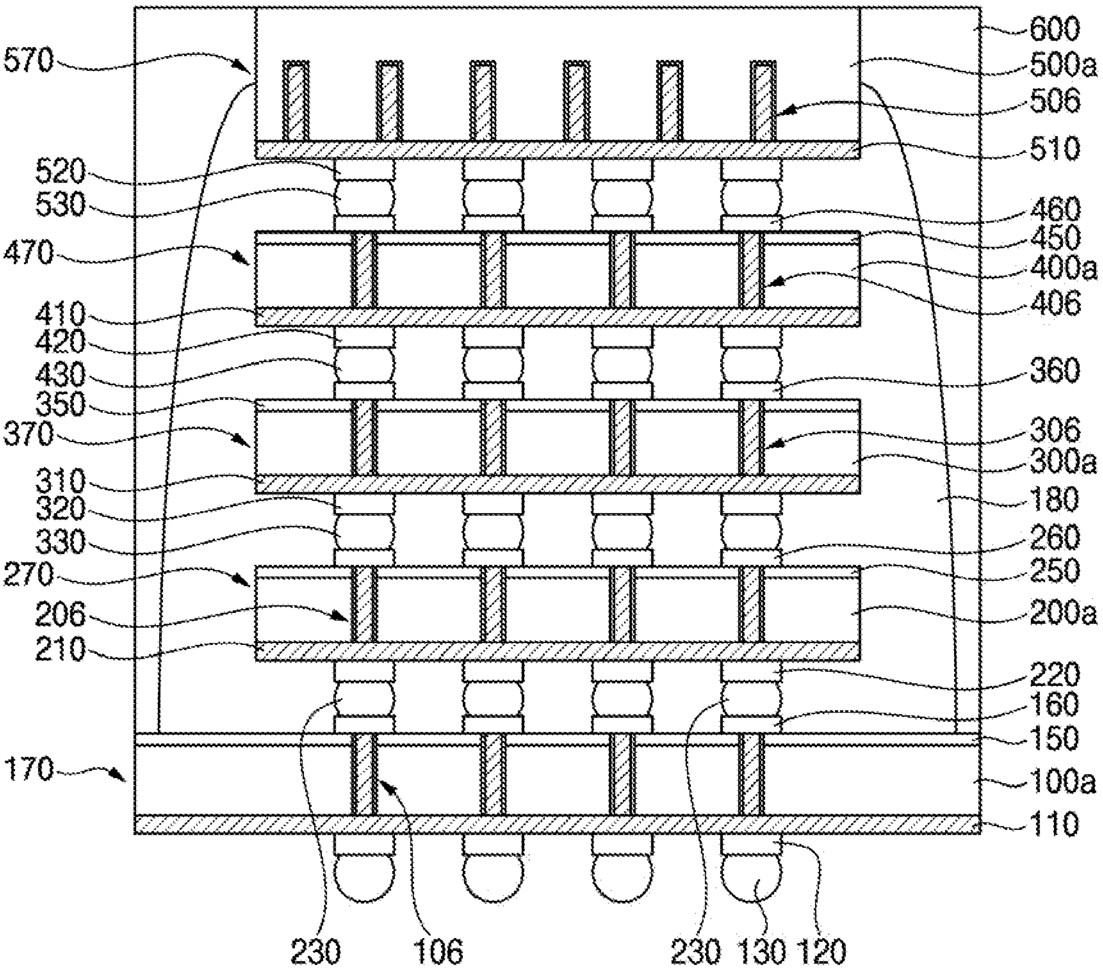
FIG. 6 is a cross-sectional view of a semiconductor package according to example embodiments.

FIG. 6 is a cross-sectional view of a semiconductor package according to example embodiments. The semiconductor package shown in FIG. 6 may be the same as the semiconductor package shown in FIG. 1, except for an uppermost semiconductor chip. Therefore, the uppermost semiconductor chip is mainly described.

Referring to FIG. 6, a semiconductor package may include stacked semiconductor chips 170, 270, 370, 470 and 570. The semiconductor package may include an adhesive material 180 filling gaps between the stacked semiconductor chips 170, 270, 370, 470 and 570. The stacked semiconductor chips 170, 270, 370, 470 and 570 may be bonded to each other.

The fifth semiconductor chip 570, which may be an uppermost semiconductor chip, of the semiconductor package may include a thermal path via 506 in the fifth substrate 500*a*. A plurality of thermal path vias 506 may be in the fifth substrate 500*a*. The thermal path vias 506 may be the same as the thermal path vias 506 described in FIG. 1, except for an arrangement thereof.

The thermal path vias 506 may have a layout different from a layout of each of the first to fourth through-silicon vias 106, 206, 306 and 406. Also, the thermal path vias 506 may have an arrangement density different from an arrangement density of each of first to fourth through-silicon vias 106, 206, 306 and 406.

In example embodiments, the number of thermal path vias 506 may be greater than the number of each of the first to fourth through-silicon vias 106, 206, 306, and 406. In this case, the arrangement density of the thermal path vias 506 may be higher than the arrangement density of each of the first to fourth through-silicon vias 106, 206, 306 and 406.

When the arrangement density of the thermal path vias 506 is high, an amount of the material having high thermal conductivity may be increased. Therefore, the thermal resistance of the semiconductor package may be decreased.

In some example embodiments, the number of thermal path vias 506 may be smaller than the number of each of the first to fourth through-silicon vias 106, 206, 306, and 406. In this case, the arrangement density of the thermal path vias 506 may be lower than the arrangement density of each of the first to fourth through-silicon vias 106, 206, 306 and 406. If it is not easy to form the thermal path via 506 having a higher arrangement density than the first to fourth through-silicon vias 106, 206, 306, and 406, the arrangement density of the thermal path vias 506 may be adjusted.

As such, the thermal path vias may have various shapes and arrangements. Hereinafter, a method of manufacturing a semiconductor package according to example embodiments may be described.

FIGS. 7 to 18 are diagrams of a method for manufacturing a semiconductor package according to example embodiments. First, a method for forming the second semiconductor chip may be described.

Figure 7:
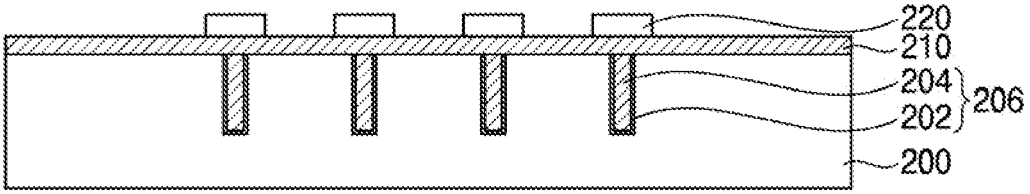
FIGS. 7 to 18 are diagrams of a method for manufacturing a semiconductor package according to example embodiments.

Referring to FIG. 7, a second circuit pattern, a second multilayer wiring, a second uppermost wiring, a second lower passivation layer, a second through-silicon via 206 and a second lower bump pad 220 may be on a first surface of an initial second substrate 200. In FIG. 7, the second circuit pattern, the second multilayer wiring, the second uppermost wiring, and the second lower passivation layer are shown as one second circuit layer 210.

The second through-silicon via 206 may extend from the first surface of the initial second substrate 200 to an inside of the initial second substrate 200. A plurality of second through-silicon vias 206 may be in the initial second substrate 200.

The initial second substrate 200 may be, e.g., a semiconductor material such as silicon, germanium, silicon-germanium, or silicon carbide, or III-V group compound semiconductors such as gallium phosphide (GaP), gallium arsenide (GaAs), or gallium antimonide (GaSb). In some example embodiments, the initial second substrate 200 may be, e.g., a Silicon-On-Insulator (SOI) substrate or a Germanium-On-Insulator (GOI) substrate.

The initial second substrate 200 may include a die region where the second circuit patterns are formed and a scribe lane region surrounding the die region. The initial second substrate 200 may be cut along the scribe lane region by a subsequent sawing process, and thus pieces of the initial second substrate 200 may serve as individual chips.

The second circuit patterns may include transistors, capacitors, or diodes. The second circuit patterns may constitute circuit elements. The second circuit patterns may be formed by performing a Front End of Line (FEOL) process for manufacturing a semiconductor device on the initial second substrate 200. The second multilayer wiring, the second uppermost wiring, the second lower passivation layer, the second through-silicon via 206 and the second lower bump pad 220 may be formed by performing a BEOL (Back End of Line) process.

To form the second through-silicon via 206, the initial second substrate 200 may be etched to form a hole extending from the first surface of the initial second substrate 200 to the inside of the initial second substrate 200. A second insulation liner 202 may be on a sidewall and a bottom of the hole. A second barrier metal layer may be on the second insulation liner 202. A second metal pattern 204 may be on the second barrier metal layer to fill the hole. In an implementation, the second through-silicon via 206 may include the second metal pattern 204 and the second insulation liner 202 surrounding sidewalls of the second metal pattern 204. The second metal pattern 204 may include, e.g., copper.

Figure 8:
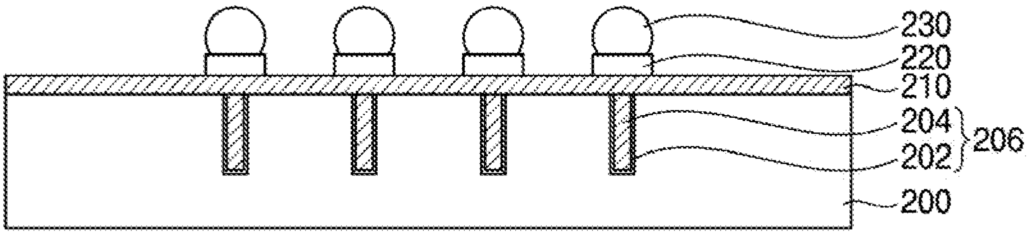

Referring to FIG. 8, second conductive bumps 230 may be on the second lower bump pads 220, respectively. Particularly, a photoresist pattern including openings may be on the second circuit layer 210 and the second lower bump pads 220, and a conductive material may be in the openings included in the photoresist pattern. The photoresist pattern may be removed, and then a reflow process may be performed to form the second conductive bumps 230. In an implementation, the conductive material may be formed by a plating process. Alternatively, the second conductive bumps 230 may be formed by a screen printing process or a deposition process.

Figure 9:
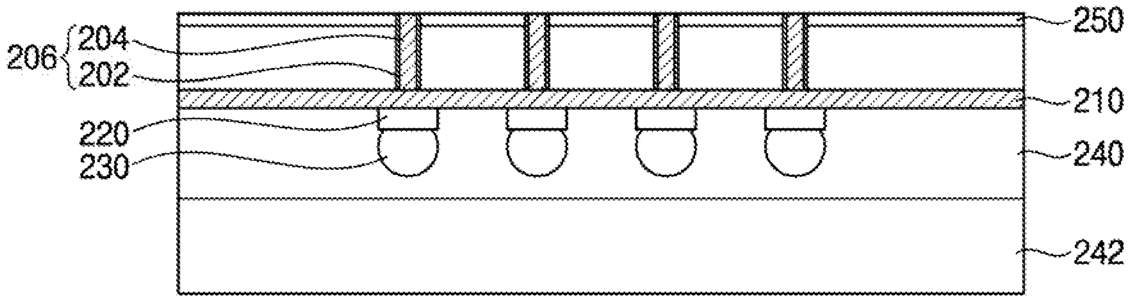
Figure 10:
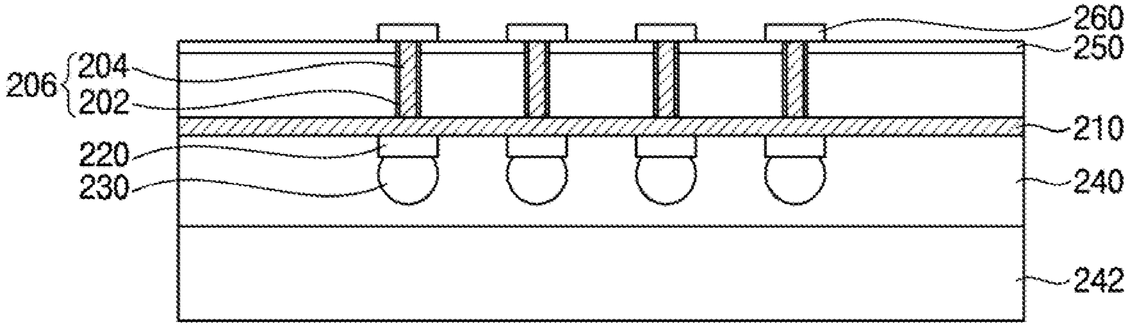
Figure 11:
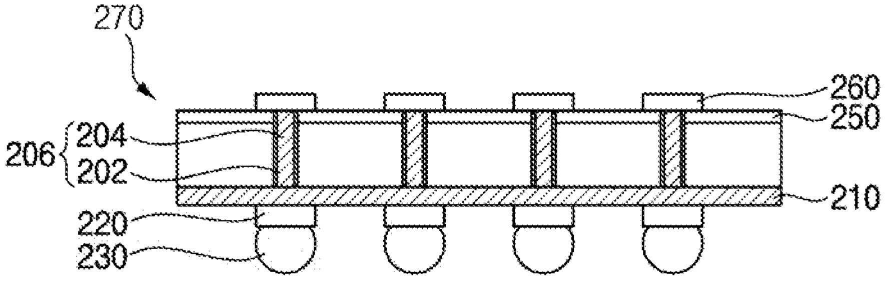

In FIGS. 9 to 11, the first surface of the initial second substrate may face downward. Referring to FIG. 9, a second carrier substrate 242 may be attached on the first surface of the initial second substrate 200 using a second adhesive layer 240. A portion of the second surface of the initial second substrate 200 may be removed to expose the second through-silicon via 206. The removing process of the initial second substrate 200 may include. e.g., a grinding process and/or a chemical mechanical polishing (CMP) process. In the removing process, the second insulation liner 202 covering the upper surface of the second through-silicon via 206 may be removed. Thus, the second insulation liner 202 may surround the sidewall of the second metal pattern 204.

The initial second substrate 200 may be etched so that one end of the second through-silicon via 206 may protrude from a second surface of a second substrate 200*a*. The second substrate 200*a* may be formed from the initial second substrate 200. In addition, one end of the second through-silicon via 206 may protrude from the second surface of the second substrate 200*a*.

A second upper passivation layer 250 may cover the second surface of the second substrate 200*a* and a surface (e.g., an upper surface) of the second through-silicon via 206. The second upper passivation layer 250 may be polished to expose the surface of the second through-silicon via 206.

Referring to FIG. 10, second upper bump pads 260 may be on the second through-silicon vias 206, respectively. The second upper bump pad 260 may be electrically connected to the second through-silicon via 206. The second upper bump pad 260 may be formed by a plating process.

Referring to FIG. 11, the second substrate 200*a* may be cut along the scribe lane region to form individual second semiconductor chips 270. The second substrate 200*a* may be cut by a sawing process. After that, the second carrier substrate 242 and the second adhesive layer 240 may be removed.

The first, third, and fourth semiconductor chips 170, 370, and 470 may be formed by the same processes for forming the second semiconductor chip. Hereinafter, a method for forming the fifth semiconductor chip, which may be the uppermost chip, may be described.

Figure 12:
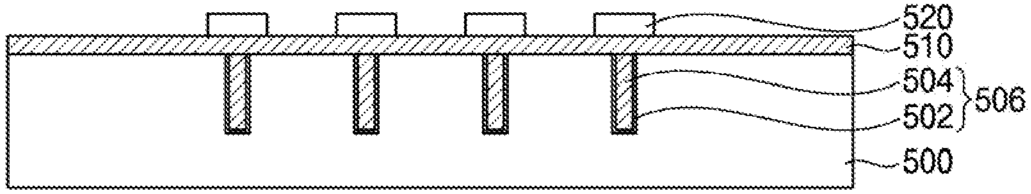

Referring to FIG. 12, a fifth circuit pattern, a fifth multilayer wiring, a fifth uppermost wiring, a fifth lower passivation layer, a thermal path via 506, and a fifth lower bump pad 520 may be on a first surface of an initial fifth substrate 500. The thermal path via 506 may extend from the first surface of the initial fifth substrate 500 to inside of the initial fifth substrate 500. In FIG. 12, the fifth circuit pattern, the fifth multilayer wiring, the fifth uppermost wiring and the fifth lower passivation layer may be shown as one fifth circuit layer 510. A plurality of thermal path vias 506 may be in the initial fifth substrate 500.

In example embodiments, the thermal path via 506 may include a metal the same as a metal of the second through-silicon via 206. In some example embodiments, the thermal path via 506 may include a conductive material different from the metal of the second through-silicon via 206. In an implementation, the thermal path via 506 may include aluminum (Al), tungsten, nickel (Ni), molybdenum (Mo), gold (Au), or silver (Ag). In some example embodiments, the thermal path via 506 may include graphene or diamond.

In some example embodiments, the thermal path via 506 may include a non-conductive material. In an implementation, the thermal path via may include PETEOS, SiCOH, SiN or SiCN.

To form the thermal path via 506, the initial fifth substrate 500 may be etched to form a hole extending from the first surface of the initial fifth substrate 500 to the inside of the initial fifth substrate 500. The fifth insulation liner 502 may be on a sidewall and a bottom of the hole. A fifth conductive pattern 504 may be on the fifth insulation liner 502. A fifth barrier metal layer 503 may be between the fifth insulation liner 502 and the fifth conductive pattern 504. In this case, the thermal path via 506 having a cross section shown in FIG. 3B may be formed.

In some example embodiments, a fifth barrier metal layer 503 and a fifth conductive pattern 504 may be directly inside the hole without forming the fifth insulation liner. In this case, the thermal path via 506 having a cross section shown in FIG. 3C may be formed.

Depending on an arrangement of the thermal path vias 506, positions of the holes may be changed. By changing the positions of the holes, one of the semiconductor devices shown in FIGS. 4 and 6 may be manufactured by subsequent processes.

Figure 13:
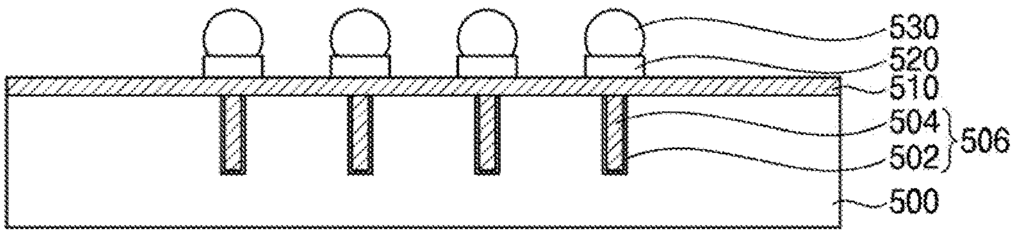

Also, the diameter and/or depth of the hole may be changed according to a target volume of the thermal path via 506. By changing the diameter and/or depth of the hole, the semiconductor device shown in FIG. 5 may be manufactured by subsequent processes. Referring to FIG. 13, fifth conductive bumps 530 may be on the fifth lower bump pads 520, respectively.

Figure 14:
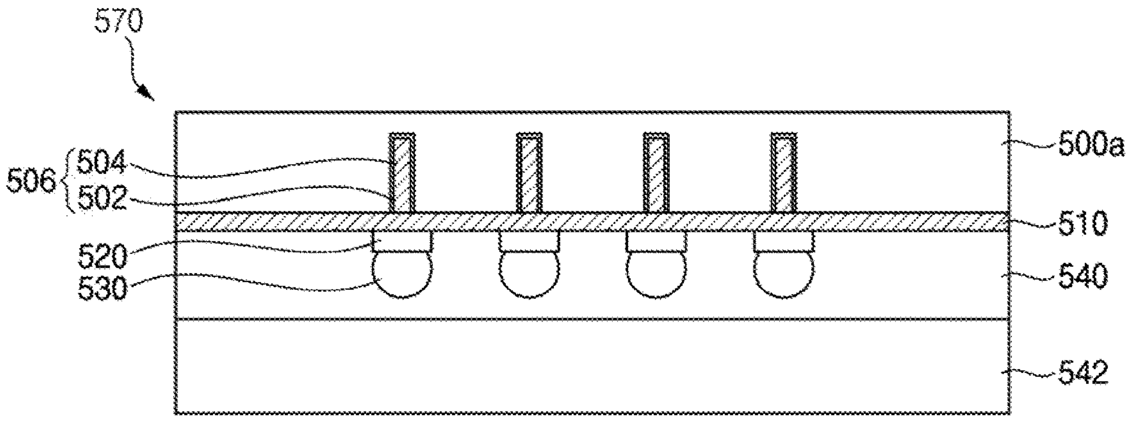

Referring to FIG. 14, a fifth carrier substrate 542 may be attached on the first surface of the initial fifth substrate 500 using a fifth adhesive layer 540. The second surface of the initial fifth substrate 500 may be removed to form a fifth substrate 500*a* having a target thickness.

Removing of the initial fifth substrate 500 may include a grinding process or a chemical mechanical polishing (CMP) process. After performing the removing process, one end of the thermal path via 506 may not be exposed to the second surface of the fifth substrate 500*a*. The thermal path via 506 may be buried in the fifth substrate 500*a*.

Figure 15:
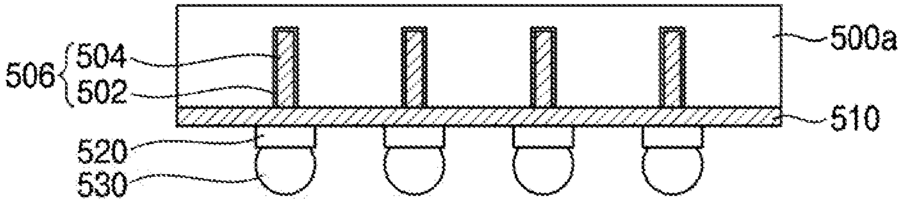

Referring to FIG. 15, the fifth substrate 500*a* may be cut along the scribe lane region to form individual fifth semiconductor chips 570. The fifth substrate 500*a* may be cut by a sawing process. After that, the fifth carrier substrate 542 and the fifth adhesive layer 540 may be removed.

Figure 16:
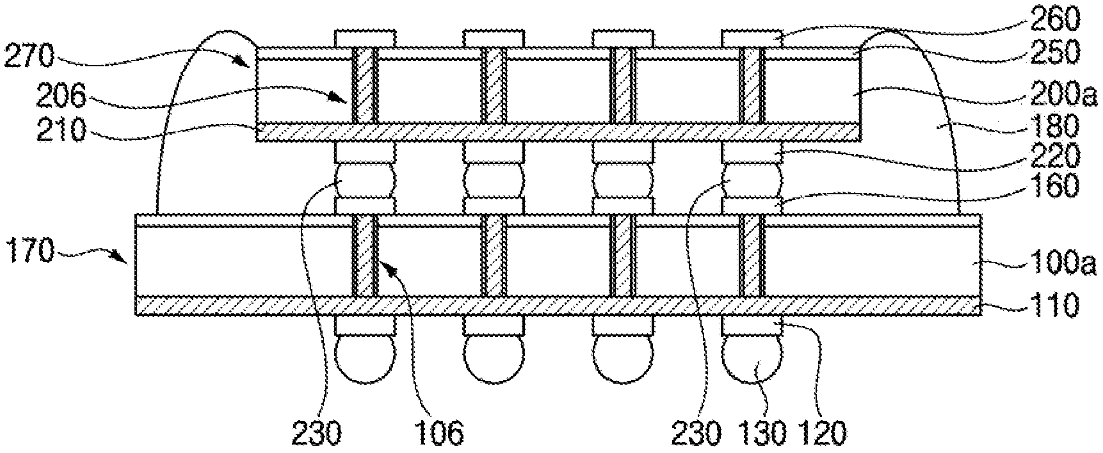
Figure 17:
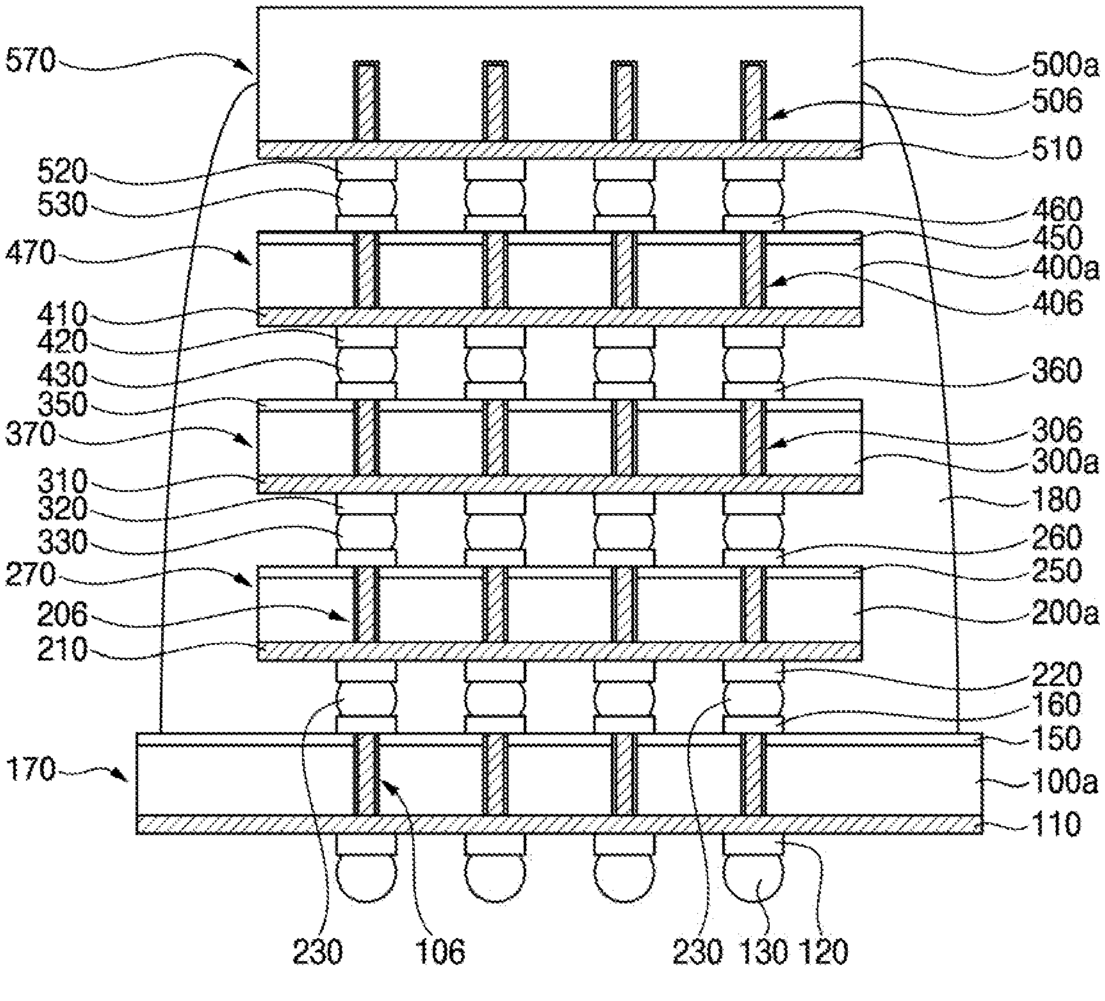

Referring to FIGS. 16 and 17, the second semiconductor chip 270 (i.e., individual second semiconductor chip) may be attached on the first substrate 100*a* on which the first semiconductor chip 170 is formed. The first substrate 100*a* may be in an unsawed state. The second semiconductor chip 270 may be attached on the first substrate 100*a* by a flip chip bonding process.

In example embodiments, the second semiconductor chips 270 may be on the first substrate 100*a* to correspond to the die regions. The first surface of the second substrate 200*a* of the second semiconductor chip 270 may face the first substrate 100*a*.

The second semiconductor chip 270 may be attached on the second surface of the first substrate 100*a* by performing a thermal compression process at a predetermined temperature (e.g., about 400° C. or less). The second semiconductor chip 270 and the first semiconductor chip 170 on the first substrate 100*a* may be bonded to each other by the thermal compression process. The second conductive bumps 230 of the second semiconductor chip 270 may be bonded to the first upper bump pads 160 on the first surface of the first substrate 100*a*, respectively. In the thermal compression process, an adhesive material 180 may be between the first substrate 100*a* and the second semiconductor chip 270. In an implementation, the adhesive material 180 may include a non-conductive layer (e.g., non-conductive film NCF) material.

The third semiconductor chip 370 may be bonded on the second semiconductor chip 270. The fourth semiconductor chip 470 may be bonded on the third semiconductor chip 370. In addition, the fifth semiconductor chip 570 may be bonded on the fourth semiconductor chip 470. A bonding between the semiconductor chips may be performed by the flip chip bonding process.

Figure 18:
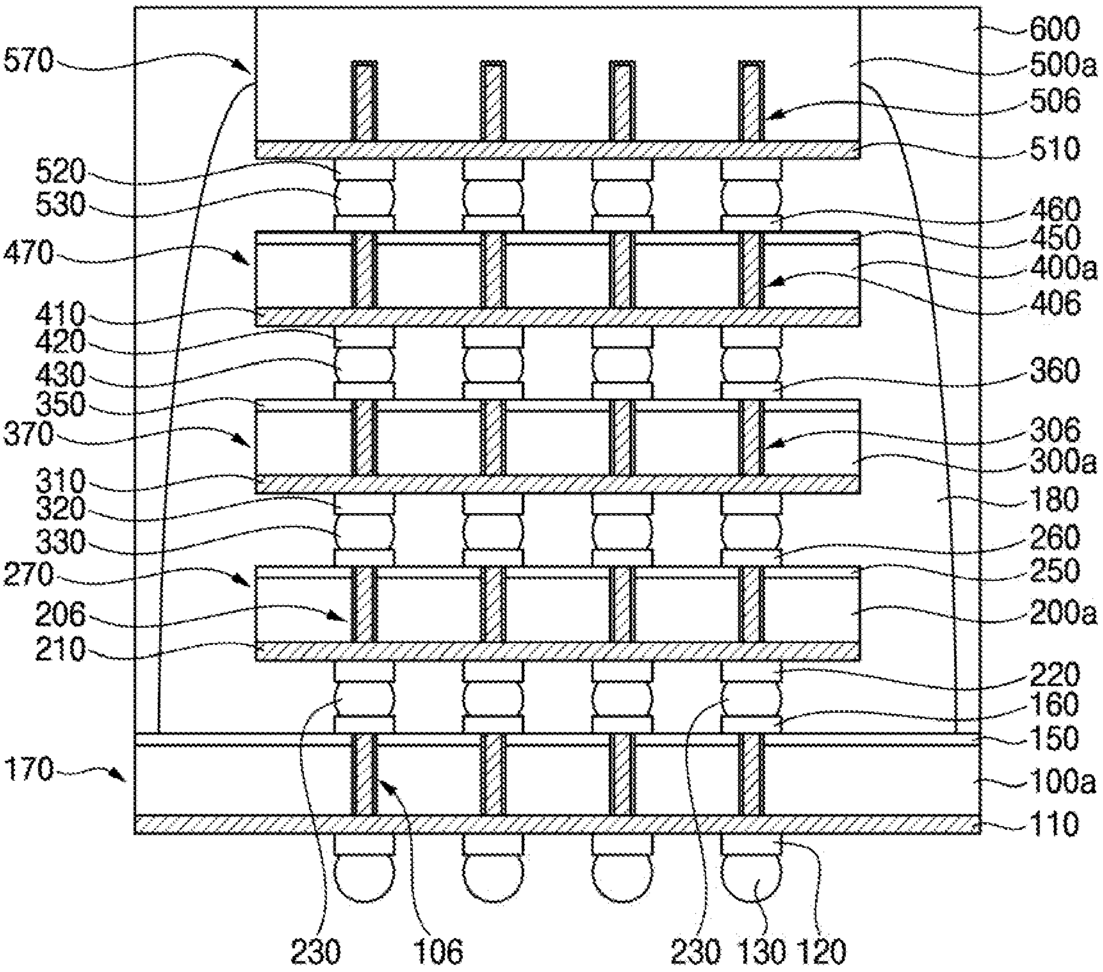

The adhesive material 180 may be between upper and lower adjacent semiconductor chips. Referring to FIG. 18, a sealing member 600 may be on a stacked structure including the first substrate 100*a* and the second to fifth semiconductor chips 270, 370, 470 and 570.

In example embodiments, the sealing member 600 may cover the second to fifth semiconductor chips 270, 370, 470 and 570 on the first substrate 100*a*. The sealing member 600 may be on the adhesive material 180. In an implementation, the sealing member 600 may include a thermosetting resin.

The first substrate 100*a* and the sealing member 600 may be cut along the scribe lane region of the first substrate 100 to form a semiconductor package. The first substrate 100*a* and the sealing member 600 may be cut by a dicing process.

In the semiconductor package, the thermal path via may be in the substrate of the uppermost semiconductor chip. Therefore, heat generated in each of semiconductor chips may be easily dissipated to outside of the semiconductor package. Accordingly, thermal resistance of the semiconductor package may be decreased.

By way of summation and review, a semiconductor package in which a plurality of semiconductor chips are stacked is disclosed. As a semiconductor package is required to store high-capacity data, the number of semiconductor chips stacked in the semiconductor package may be increased. Therefore, vertical thermal resistance of the semiconductor package may be increased. In the semiconductor package according to the example embodiments, the uppermost semiconductor chip included in the semiconductor package may include the thermal path via providing heat transfer path. Thermal path via may include the material having the thermal conductivity higher than the thermal conductivity of the substrate of the uppermost semiconductor chip. Accordingly, as heat within the semiconductor package is easily conducted by the thermal path via, vertical thermal resistance of the semiconductor package may be decreased. Example embodiments provide a semiconductor package with reduced thermal resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:

a plurality of first semiconductor chips sequentially stacked, each of the plurality of first semiconductor chips including a circuit layer on a first surface of a first substrate, a through-silicon via passing through the first substrate, and a bump pad connected to the through-silicon via;

a second semiconductor chip on an uppermost first semiconductor chip, the second semiconductor chip including a circuit layer on a first surface of a second substrate, and a thermal path via extending into an inside of the second substrate;

an adhesive material filling a gap between the second semiconductor chip and the plurality of first semiconductor chips and gaps between adjacent ones of the plurality of first semiconductor chips; and a sealing member covering the adhesive material, the second semiconductor chip, and each of the plurality of first semiconductor chips, wherein the through-silicon via includes a first conductive pattern, a first barrier layer, and an insulation liner that contacts the first barrier layer, wherein the first substrate contacts a sidewall of the insulation liner, wherein the thermal path via includes a second conductive pattern, and a second barrier layer that contacts a sidewall and an upper surface of the second conductive pattern, and wherein the second substrate contacts a sidewall and an upper surface of the second barrier layer.

2. The semiconductor package as claimed in claim 1, wherein the thermal path via includes a material having a thermal conductivity higher than a thermal conductivity of a material of the second substrate.

3. The semiconductor package as claimed in claim 1, wherein the first conductive pattern includes a first metal, and the second conductive pattern includes a second metal the same as the first metal of the through-silicon via.

4. The semiconductor package as claimed in claim 1, wherein the second conductive pattern includes a second conductive material different from a first conductive material of the first conductive pattern.

5. The semiconductor package as claimed in claim 1, wherein the thermal path via includes copper, aluminum, tungsten, nickel, molybdenum, gold, silver, graphene, or diamond.

6. The semiconductor package as claimed in claim 1, wherein:

the thermal path via is one of a plurality of thermal path vias, and the through-silicon via is one of a plurality of through-silicon vias, and a layout of the plurality of the thermal path vias is the same as a layout of the plurality of the through-silicon vias.

7. The semiconductor package as claimed in claim 1, wherein:

the thermal path via is one of a plurality of thermal path vias, and the through-silicon via is one of a plurality of through-silicon vias, and a first layout of the plurality of the thermal path vias is different from a second layout of the plurality of the through-silicon vias.

8. The semiconductor package as claimed in claim 1, wherein:

the thermal path via has a first diameter the same as a second diameter of the through-silicon via, and the thermal path via has a first vertical height the same as a second vertical height of the through-silicon via.

9. The semiconductor package as claimed in claim 1, wherein the thermal path via has a first volume different from a second volume of the through-silicon via.

10. The semiconductor package as claimed in claim 1, wherein a first vertical height of the thermal path via is 10% to 90% of a total thickness of the second substrate.

11. A semiconductor package, comprising:

a first semiconductor chip including a circuit layer on a first surface of a first substrate, a first through-silicon via passing through the first substrate, a first lower bump pad on the first surface of the first substrate and connected to the first through-silicon via, and a first upper bump pad on a second surface opposite the first surface of the first substrate and connected to the first through-silicon via;

a second semiconductor chip including a circuit layer on a first surface of a second substrate, a second through-silicon via passing through the second substrate, a second lower bump pad on the first surface of the second substrate and connected to the second through-silicon via, a second upper bump pad on a second surface opposite the first surface of the second substrate and connected to the second through-silicon via, and a first conductive bump bonding the first and second semiconductor chips between the first upper bump pad and the second lower bump pad;

a third semiconductor chip including a circuit layer on a first surface of a third substrate, a thermal path via extending from the first surface of the third substrate to an inside of the third substrate, a third lower bump pad on the first surface of the third substrate, and a second conductive bump for bonding the second and third semiconductor chips between the second upper bump pad and the third lower bump pad;

an adhesive material filling a gap between the first and second semiconductor chip and a gap between the second semiconductor chip and the third semiconductor chip; and a sealing member covering the first to third semiconductor chips and the adhesive material, wherein the first through-silicon via includes a first conductive pattern, a first barrier layer, and a first insulation liner that contacts the first barrier laver;

wherein the first substrate contacts a sidewall of the first insulation liner;

wherein the second through-silicon via includes a second conductive pattern, a second barrier layer, and a second insulation liner that contacts the second barrier layer, wherein the second substrate contacts a sidewall of the second insulation liner, wherein the third semiconductor chip is an uppermost chip, wherein the thermal path via includes a third conductive pattern, and a third barrier layer that contacts a sidewall and an upper surface of the third conductive pattern, and wherein the third substrate contacts a sidewall and an upper surface of the third barrier layer.

12. The semiconductor package as claimed in claim 11, wherein the thermal path via is aligned with the third lower bump pad in a vertical direction.

13. The semiconductor package as claimed in claim 11, wherein the thermal path via is not aligned with the third lower bump pad in a vertical direction.

14. The semiconductor package as claimed in claim 11, wherein the thermal path via is not electrically connected to the third lower bump pad.

15. The semiconductor package as claimed in claim 11, wherein the thermal path via includes a first material having a first thermal conductivity higher than a second thermal conductivity of the third substrate.

16. The semiconductor package as claimed in claim 11, wherein a first vertical height of the thermal path via is 10% to 90% of a total thickness of the third substrate.

17. A semiconductor package, comprising:

a plurality of first semiconductor chips sequentially stacked, each of the plurality of first semiconductor chips including a circuit layer on a first surface of a first substrate, a through-silicon via passing through the first substrate, and a bump pad connected to the through-silicon via; and a second semiconductor chip stacked on an uppermost first semiconductor chip, the second semiconductor chip including a circuit layer on a first surface of a second substrate, and a thermal path via extending from the first surface of the second substrate to an inside of the second substrate and the thermal path via in the second substrate;

an adhesive material filling a gap between the second semiconductor chip and the plurality of first semiconductor chips and gaps between adjacent ones of the plurality of first semiconductor chips; and a sealing member covering the second semiconductor chip and each of the plurality of first semiconductor chips, wherein the through-silicon via includes a first conductive pattern passing through the first substrate, a first barrier layer and a first insulation liner surrounding a sidewall of the first conductive pattern, wherein the first substrate contacts a sidewall of the first insulation liner, wherein the second semiconductor chip is an uppermost chip, wherein the thermal path via includes a second conductive pattern in a hole extending to the inside of the second substrate, and a barrier layer that contacts a sidewall and an upper surface of the second conductive pattern, and wherein the second substrate contacts a sidewall and an upper surface of the barrier layer.

* * * * *